(12) United States Patent
Frühauf et al.

(10) Patent No.: US 11,874,337 B2
(45) Date of Patent: Jan. 16, 2024

(54) RELIABLE FAULT DETECTION AND FAULT LOCALIZATION IN A LOAD ZONE OF A DC SYSTEM

(71) Applicant: Siemens Aktiengesellschaft, Munich (DE)

(72) Inventors: Markus Frühauf, Uttenreuth (DE); Benno Weis, Hemhofen (DE)

(73) Assignee: Siemens Aktiengesellschaft, Munich (DE)

( * ) Notice: Subject to any disclaimer, the term of this patent is extended or adjusted under 35 U.S.C. 154(b) by 269 days.

(21) Appl. No.: 17/604,705

(22) PCT Filed: Mar. 24, 2020

(86) PCT No.: PCT/EP2020/058084
§ 371 (c)(1),
(2) Date: Oct. 18, 2021

(87) PCT Pub. No.: WO2020/221514
PCT Pub. Date: Nov. 5, 2020

(65) Prior Publication Data
US 2022/0206081 A1  Jun. 30, 2022

(30) Foreign Application Priority Data
Apr. 30, 2019 (EP) .................................. 19171874

(51) Int. Cl.
*G01R 31/40* (2020.01)
*G01R 1/36* (2006.01)
(Continued)

(52) U.S. Cl.
CPC .............. *G01R 31/40* (2013.01); *G01R 1/36* (2013.01); *G01R 19/14* (2013.01); *H02H 7/268* (2013.01); *H02J 1/00* (2013.01)

(58) Field of Classification Search
CPC ...... H02H 7/268; H02H 1/0007; H02H 3/046; H02H 3/10; H02H 3/087; G01R 31/086;
(Continued)

(56) References Cited

U.S. PATENT DOCUMENTS

2015/0138681 A1 * 5/2015 Mayes ..................... H02H 3/05
361/93.7
2016/0352091 A1   12/2016 Qi et al.

FOREIGN PATENT DOCUMENTS

DE          4033444 A1 *  4/1992
DE        41 42 760 C1    4/1993
(Continued)

OTHER PUBLICATIONS

PCT International Search Report and Written Opinion of International Searching Authority dated Jun. 2, 2020 corresponding to PCT International Application No. PCT/EP2020/058084 filed Mar. 24, 2020.

*Primary Examiner* — Ryan Johnson
(74) *Attorney, Agent, or Firm* — Henry M. Felereisen LLC

(57) ABSTRACT

A load zone of a DC system includes a connection interface for supplying the load zone with electrical energy, an electronic switch arranged between the connection interface and a DC bus, and at least two electrical devices connected in parallel to the DC bus. A voltage sensor measures a voltage across a fuse arranged between the DC bus and a respective electrical device. An evaluation unit identifies a defective device of the at least two electrical devices based on a polarity of the voltage measured by the voltage sensor across the fuse. A DC system with such a load zone and an energy source connected to the connection interface of the load zone, as well as a method for operating such load zone or DC system are also disclosed. A device is identified as
(Continued)

being defective when the voltage measured across the fuse exceeds a specified limit value.

15 Claims, 2 Drawing Sheets

(51) Int. Cl.
  *G01R 19/14*   (2006.01)
  *H02H 7/26*   (2006.01)
  *H02J 1/00*   (2006.01)

(58) Field of Classification Search
  CPC ........... G01R 19/14; H01H 2085/0266; H01H 85/30; H02J 1/00; H02M 1/32; Y04S 10/52
  See application file for complete search history.

(56) References Cited

FOREIGN PATENT DOCUMENTS

| | | | |
|---|---|---|---|
| DE | 10 2014 014 469 A1 | 3/2015 | |
| EP | 3 098 921 A1 | 11/2016 | |
| WO | WO-2017090980 A1 * | 6/2017 | ........... G01R 19/165 |

\* cited by examiner

RELIABLE FAULT DETECTION AND FAULT LOCALIZATION IN A LOAD ZONE OF A DC SYSTEM

CROSS-REFERENCES TO RELATED APPLICATIONS

This application is the U.S. National Stage of international Application No. PCT/EP2020/058084, filed Mar. 24, 2020, which designated the United States and has been published as International Publication No. WO 2020/221514 A1 and which claims the priority of European Patent Application, Serial No, 19171874.1, filed Apr. 30, 2019, pursuant to 35 U.S.C. 119(a)-(d).

BACKGROUND OF THE INVENTION

The invention relates to a load zone comprising an electronic switch, a DC bus and at least two electrical devices, the electronic switch being so arranged as to separate the DC bus from an energy source that can be connected to the load zone, the electrical devices each being electrically connected to the DC bus. The invention further relates to a DC system having such a load zone and an energy source, the energy source being connected to the load zone in such a way that the electrical devices can be supplied with electrical energy from the energy source. The invention further relates to a method for operating such a load zone or such a DC system.

Electrical systems nowadays are no longer designed exclusively as AC voltage systems, Increasing numbers of electrical systems are embodied as DC systems. In this case, various electrical devices are arranged in parallel on a DC bus. The DC bus consists of at least two electrical conductors between which a DC voltage is applied. These then supply electrical energy to the electrical devices arranged in parallel. The electrical devices can be electrical consumer units or energy storage units. The electrical consumer units in this case can also be capable of return feed, feeding the stored energy into the DC bus. The stored energy can be a charged capacitor or a coil through which current flows. Equally, the return feed can be provided by kinetic or rotational energy of a drive system. Such a drive system can likewise represent an electrical device.

In this case, a plurality of electrical devices are often combined to form a so-called load zone. An electronic switch is located at the entry point of such a load zone. By means of this electronic switch, it is possible to separate the load zone from an energy source or a plurality of energy sources, in particular a voltage source, which supplies the load zone with electrical energy. This separation can occur in the event of a fault, for example, such as a short circuit, in order to protect the electrical consumer units of the load zone or even the other components of the DC system outside the load zone. Specifically, the repercussions of the fault on other load zones of the DC system are reliably prevented thereby. In particular, by means of its control or logic, the electronic switch can quickly and reliably detect a short circuit in the load zone and separate this load zone from the energy source in order to protect the DC system. The electronic switch in this case interrupts the current, the so-called line current, which flows from the energy source into the load zone. Only the sum of the current from the neighboring electrical devices arranged in parallel can then flow into the point of the fault.

As a result of deploying the electronic switch, the separation from the energy source can be effected quickly and without arcing. This allows reliable operation, even in the case of low-inductance systems with high rates of current rise in the event of faults such as a short circuit. Since this electronic switch is comparatively expensive it is not deployed for protection at every electrical device, but only upstream of a parallel connection of a plurality of devices which form a load zone.

With the aid of the electronic switch, it is possible to limit the effects of a fault on the corresponding load zone.

The object of the invention is to improve a load zone of a DC system in respect of the fault detection and fault localization, e.g. in the event of a short circuit.

SUMMARY OF THE INVENTION

This object is achieved by a load zone comprising an electronic switch, a DC bus and at least two electrical devices, the electronic switch being so arranged as to separate the DC bus from an energy source that can be connected to the load zone, the electrical devices each being electrically connected to the DC bus, a fuse being arranged between the DC bus and the respective electrical device, a voltage sensor being so arranged as to be able to capture a voltage across the fuse. In particular, this object is achieved by a load zone comprising an electronic switch, a DC bus, a connection interface for supplying the load zone with electrical energy, and at least two electrical devices, the electronic switch being arranged between the connection interface and the DC bus, the electrical devices each being electrically connected in parallel to the DC bus, a fuse being arranged between the DC bus and the respective electrical device, a voltage sensor being so arranged as to capture a voltage across the fuse. This object is further achieved by a DC system comprising such a load zone and at least one energy source, said energy source being connected to the connection interface of the load zone, in particular being connected to the load zone in such a way that the electrical devices can be supplied with electrical energy from the energy source and that the electrical connection between the energy source and the DC bus can be interrupted by means of the electronic switch. This object is further achieved by a method for operating such a bad zone or such a DC system, a defective device of the electrical devices being identified on the basis of the voltage across the fuse in that the voltage across the fuse exceeds a specifiable limit value.

Further advantageous embodiments of the invention are specified in the dependent claims.

The invention is based on the finding that a defective device among the electrical devices can be detected and/or identified by measuring the respective voltages across the fuses of the bad zone by means of the respective voltage sensor. The electrical devices are often referred to as consumer units or loads. These electrical consumer units or loads can also be capable of return feed. The detection of the defective device within the bad zone is also referred to as fault localization.

A load zone is an arrangement comprising a multiplicity of electrical devices, i.e. at least two electrical devices, which are supplied with electrical energy via a DC bus and an electronic switch. The DC bus and the electronic switch are part of the corresponding load zone in this case. The electrical devices of a load zone can be separated as a group from an energy source or from a plurality of energy sources by means of the electronic switch.

If one of the fuses has tripped, i.e. the conductive connection between the connection interfaces of this fuse is interrupted, the defective device can easily be detected since it is the electrical device that is connected via this tripped fuse to the DC bus. The problem can however arise that if a short circuit occurs in an electrical device its fuse might not trip quickly enough, and instead the electronic switch of the load zone interrupts the connection to the energy source, in particular a voltage source, so quickly that the required energy is no longer available to trip the fuse. In this case, it is not possible on the basis of the status of the fuses to detect in which electrical device of the load zone the fault occurred.

It is therefore considered advantageous for a fault to be detected even before the fuse is tripped, so quickly that tripping of the fuse is no longer necessary and other protective measures such as opening the electronic switch can be used instead. Since no fuse has tripped, the identification of the defective device is difficult. By applying the inventive method, the defective device can though also be reliably detected in this case.

According to the invention, the defective device can however be identified on the basis of the voltage across the fuse, said voltage being measured by the voltage sensor. If a fault is present in one of the electrical devices and the electronic switch has interrupted the connection to the energy source, an exchange of energy can then only take place between the electrical devices of the load zone. In this case, with regard to the positive potential of the DC bus, the current flows from the non-defective devices into the defective device. The direction of the current flow can also be detected, with reference to the voltages measured across the fuses, on the basis of the polarity of the voltage across the fuse. It is thereby possible to detect the defective device, since it causes a voltage across the fuse which is produced by the current flow through the resistance of the fuse. It can be assumed that those electrical devices which release energy are not defective.

The fuse is usually arranged in the connection between the electrical device and the positive potential of the DC bus. It is however alternatively or additionally possible in the same way to arrange this fuse or a further additional fuse in the connection to the negative potential of the DC bus. In this case, the current flows out of the defective device.

It is therefore possible in the event of a fault, particularly after the electronic switch has already opened due to the fault, to determine the defective device with the aid of the voltage sensors which measure the voltage across the fuse in each case. This can be effected in a simple manner, e.g. on the basis of the polarities of the voltages and therefore the knowledge of the current flow directions.

The value of the resistance of the individual fuses is subject to great variability. It is therefore also difficult to assign a current value to the measured voltage. For the purpose of the method, however, the polarity of the voltage is shown to provide sufficient information to indicate the electrical device having the fault. It is therefore possible irrespective of the variability of the resistance values to reliably determine the site of the fault.

Alternatively or additionally, it is also possible to use the voltage level of the measured values of the respective voltage sensors for determining the defective device. It can be assumed in this case that as a result of the fault, e.g. a short circuit, the current in the defective device assumes high values, in particular a value which is so high as to differ by at least an order of magnitude from a normal operational current, and/or shows a significant voltage change. Both a correspondingly high current value and a correspondingly high speed of change of the current can be reliably detected by means of the voltage sensor in the voltage across the respective fuse. Furthermore, the relatively inexact relationship between the current strength and the measured voltage, resulting from the great variability of the resistance values for the fuse, does not have a detrimental effect here, since it is only necessary to distinguish between a fault current and an appropriate operational current. This is shown to be reliably possible even with corresponding variability of the resistance values of the fuses.

It is particularly advantageous that the resistance of the fuse increases as the temperature rises. A fault current represents a particularly high current and quickly results in heating of the fuse. This therefore also increases the voltage drop across the fuse in the event of a fault. The fault current is at least significantly greater than a current which occurs during normal operation. A fault current therefore produces a disproportionally high voltage drop across the fuse as a result of the heating of the fuse. The fault current can therefore be detected particularly reliably.

It is moreover particularly advantageous in this application that the use of a current transformer is not required. Even without a current transformer, the fault can be reliably localized in one of the electrical devices.

In this case, the specified limit value can also be sign-dependent according to the character of the electrical device, e.g. in the case of electrical devices capable of return feed. This means that tripping of the switch in a first voltage direction has a different limit value than is used for an opposite polarity to the first voltage direction. This means that the protective measures can be initiated by opening the switch as a function of the operating state of the electrical device.

In an advantageous embodiment of the invention, the connection between DC bus and respective electrical device is embodied without a current transformer. This means that no current transformer is arranged in this connection between DC bus and respective electrical device. Since it is possible to dispense with the current transformer for the purpose of detecting or localizing the fault, the individual lines of the DC bus, to which lines the electrical devices are attached, can be realized in a particularly inexpensive manner since no current transformer is required. This means that no losses are produced by the current transformer, such as would be produced using e.g. an instrument shunt. The absence of a current transformer in this arrangement makes the load zone particularly inexpensive and low-loss. It is therefore possible to provide a particularly economical solution with a high level of efficiency.

In a further advantageous embodiment of the invention, the electrical device having the highest voltage measured by the voltage sensor is identified as the defective device. In addition to considering the polarities of the voltages, it proves advantageous to additionally take the voltage level into account. A fault-free device might not feed energy (back) into the defective device. For example, this applies if the fault-free device does not have an energy storage unit. For example, purely ohmic consumer units such as e.g. heating units therefore cannot feed energy into the defective consumer unit. Likewise, an inductive consumer unit can still continue to draw energy from the DC bus if there is a fault in another electrical device of the load zone. Therefore there may be a multiplicity of electrical consumer units which do not feed any energy into the defective consumer unit. As illustrated by the example of the inductive electrical device, it is also possible that these even continue to draw energy from the remaining fault-free consumer units. In this case, it is advantageous to evaluate not only the polarities of the measured voltages, but also the voltage level. It can be assumed in this case that the fault is present in that electrical device in whose connection to the DC bus the highest voltage is or was measured across the fuse by the voltage sensor. This means that the electrical device having the highest voltage measured by the voltage sensor is the defective device.

In this case, the voltage of the voltage sensor is positive if the line with the affected electrical device draws electrical energy. Correspondingly, the voltage at the voltage sensor is negative if the corresponding line with its electrical consumer unit releases energy to the DC bus.

In a further advantageous embodiment of the invention, the defective device is detected in that the voltage measured by the voltage sensor exceeds a specifiable limit value, Irrespective whether the electronic switch is closed or already open due to e.g. a fault in the load zone, a fault in an electrical device of the load zone can be detected and localized in that the voltage measured by the voltage sensor is compared with a specifiable limit value. If this voltage exceeds the limit value, it can be assumed that a fault is present in the electrical device concerned. It is particularly advantageous for the limit value to be greater by at least an order of magnitude than a voltage which, irrespective of the resistance of the fuse, arises in the case of a normal operational current through the fuse. In this case, irrespective of the resistance value means that the limit value is determined in the context of a worst case scenario for the resistance of the fuse. As long as the electronic switch remains closed, this transgression of the limit value can also be used as a criteria for opening the electronic switch.

In contrast with the tripping of the fuse, only a short-term transgression of the limit value by the measured voltage is required in order to be able not only to reliably detect and localize a fault but also to trigger a protective reaction such as opening the electronic switch, for example.

Here again, the voltage of the voltage sensor is positive if the line with the affected electrical device draws electrical energy. Correspondingly, the voltage at the voltage sensor is negative if the corresponding line with its electrical consumer units releases energy to the DC bus. If the voltage sensor is operated with a different polarity, i.e. if an electrical energy flowing in the line causes a negative voltage across the fuse, the defective device is detected in that the voltage measured by the voltage sensor is less than a specifiable negative limit value.

In a further advantageous embodiment of the invention, the defective device is identified when or after a fault in the load zone occurs, wherein the peak value of the voltage across the fuse is captured and stored as a data value in each case and is used for the identification of the defective device. In a corresponding load zone, a peak value of the voltage across the fuse can be captured and stored as a data value in each case, in particular by means of a peak value rectifier arranged between the fuse and the voltage sensor. For the purpose of identifying the defective device, the peak value of the voltage that occurs is of primary importance. It is possible to detect from this that a corresponding peak value of a current must also have been present in the corresponding electrical device. This means that the corresponding peak value can be used for the purpose of identifying the defective device instead of the measured value. With this peak value likewise, it is possible to use the correspondingly highest peak value of all measured voltages in order to identify the defective device. The data value can likewise be compared with a specifiable limit value and a fault detected in the load zone if the limit value is exceeded. The fault is present at the electrical device in whose line the voltage at the fuse exceeded the specifiable limit value.

The storage can take place, for example, by storing the voltage in a data processing entity. Alternatively, the voltage value can be stored with the aid of a peak value rectifier which has a capacitor at the output. In this case, the voltage of the peak value that occurred is retained by the capacitor at its two connection interfaces. It is particularly advantageous in this embodiment that the defective device can be detected in a particularly simple manner even after the occurrence of the fault. This is possible because the peak value is stored correspondingly. As explained above, this storage can take place in a similar manner by means of a voltage at the capacitor of a peak value rectifier or within the data processing entity in which a corresponding voltage value was stored as a data value.

It is advantageous in this embodiment variant that the method for operating the load zone does not have to be executed continuously, but only if a fault is present in the load zone. This saves computing time and computing power with regard to open-loop or closed-loop control of the load zone.

In a further advantageous embodiment of the invention the stored data value is reduced, in particular reset, if there is a negative voltage across the fuse. In a corresponding bad zone, the respective stored data value can be reduced, in particular reset, if a negative voltage occurs across the fuse. A negative voltage across the fuse occurs primarily if the corresponding electrical consumer unit releases electrical energy. It must be assumed from this that no fault is present at this electrical consumer unit. It has therefore proven advantageous to take this state of the captured negative voltage into account to the effect that the stored data value for the peak value is reduced or even reset, i.e. set to zero. This can be achieved by discharging the capacitor at the output of a peak value rectifier, or completely discharging it for a reset. Alternatively, this can also be achieved by overwriting the stored data value with a new smaller value or by the value zero in the data processing entity. As a result of this action, the differences in the stored data values of the respective voltage sensors are increased, because a negative voltage occurs at the return-feeding non-faulty devices in the event of a fault such as a short circuit, for example. However, a positive voltage occurs in the case of a faulty device. This positive voltage can be detected in a particularly simple and reliable manner by this exemplary embodiment. The reliability of fault localization is further increased thereby.

In a further advantageous embodiment of the invention, the positive peak value is captured and stored as a stored data value, a further data value being captured and stored which corresponds in each case to the negative peak value of the voltage across the fuse. In this embodiment it is possible to dispense with a corresponding reduction or reset of the data values. For each voltage sensor, the maximum positive value is captured and stored as a positive peak value in this case. In addition to this, the minimum negative value is captured and stored as a further data value. This is referred to as the negative peak value. It is therefore easily possible, for each electrical consumer unit, to detect whether at the time point of the fault it was drawing electrical energy from or feeding electrical energy into the DC bus. This can be detected by ascertaining which of the two peak values, the positive peak value or the negative peak value, is greater. If the positive peak value is greater, it can be assumed that electrical energy was being drawn from the DC bus. If however the negative peak value is greater, it can be assumed that electrical energy was being released in the direction of the DC bus, Therefore, in addition to the criterion of the greatest positive peak value for identifying the defective device, a further criterion is available. In this case, those electrical devices for which the positive peak value, i.e. the stored data value, is greater than the negative peak value, i.e. the further data value, are primary possibilities for an electrical device in which a fault may be present. It can then be tested which of the possible electrical devices captured the highest positive peak value. By means of this double criterion, a defective device can be detected particularly reliably.

In a further advantageous embodiment of the invention, the time point at which the stored data value and/or stored further data value occurred is captured and stored, wherein the detection of the defective device takes place as a function of the time points of the stored data values. As a result of knowing the time points at which the peak value occurred, it is easily possible to deduce the status of the electrical devices at the time point of the fault in the load zone. The time point of the occurrence of the fault is indicated by the greatest voltage value measured by one of the voltage sensors and stored as a data value. It is then possible to determine the status of all electrical devices on the basis of the stored data values or the further data values at the time point of the fault or in the immediate timeframe thereof, e.g. in the order of up to 10 ms before or after. In this case, the temporal correlation between the positive and the negative peak value is retained by each evaluation unit in such a way that it is possible subsequently to detect which value occurred first. By virtue of this additional information, it is possible to exclude misinterpretations with regard to the fault analysis in the case of polarity reversal events in extended DC sections with a wide power spectrum at the consumer unit. The reliability with regard to the identification of the fault and the defective device is further increased thereby.

In a further advantageous embodiment of the invention, the method is started when a fault is present in the load zone. The structure of the load zone, with one electronic switch and the plurality of at least two electrical devices, allows the method for operating this load zone to be started only if a fault is present in the load zone. In this case, the electronic switch with a corresponding evaluation device or an open-loop or closed-loop control device can be so designed as to detect a fault in the load zone and thereupon to correspondingly react by opening the electronic switch. The identification of the defective device among the electrical devices of the load zone can then be performed by the method for operating the load zone. If no measured values of the voltage sensors are stored, the method should be started as quickly as possible if a fault is present in the load zone, so that the peak values are still available to the method. However, the voltages which appear after opening the electronic switch can also be used to identify the defective device. Reliable identification of the defective device is also possible using these voltage values and/or data values as described above. In particular with storage of the corresponding measured values of the voltage sensor, the identification of the defective device can also be postponed to virtually any desired time point after occurrence of the fault and opening of the electronic switch. This is because the information required to identify the defective device remains continuously available, or at least for a sufficiently long time, to the corresponding evaluation unit. This method hi which the evaluation is only started after or when a fault is present in the load zone has the advantage that no significant computing capacity is required for normal operation. A corresponding computing capacity and processing capacity for the respective measured values of the voltage sensors only becomes necessary when a fault is present. Continuous monitoring of the voltages or currents in the load zone is not required. This method for identifying a defective device among the electrical devices can therefore be performed in a particularly simple and resource-saving manner.

BRIEF DESCRIPTION OF THE DRAWING

The invention is described and explained in greater detail below with reference to the exemplary embodiments illustrated in the figures, in which.

DETAILED DESCRIPTION OF PREFERRED EMBODIMENTS

Figure 1:
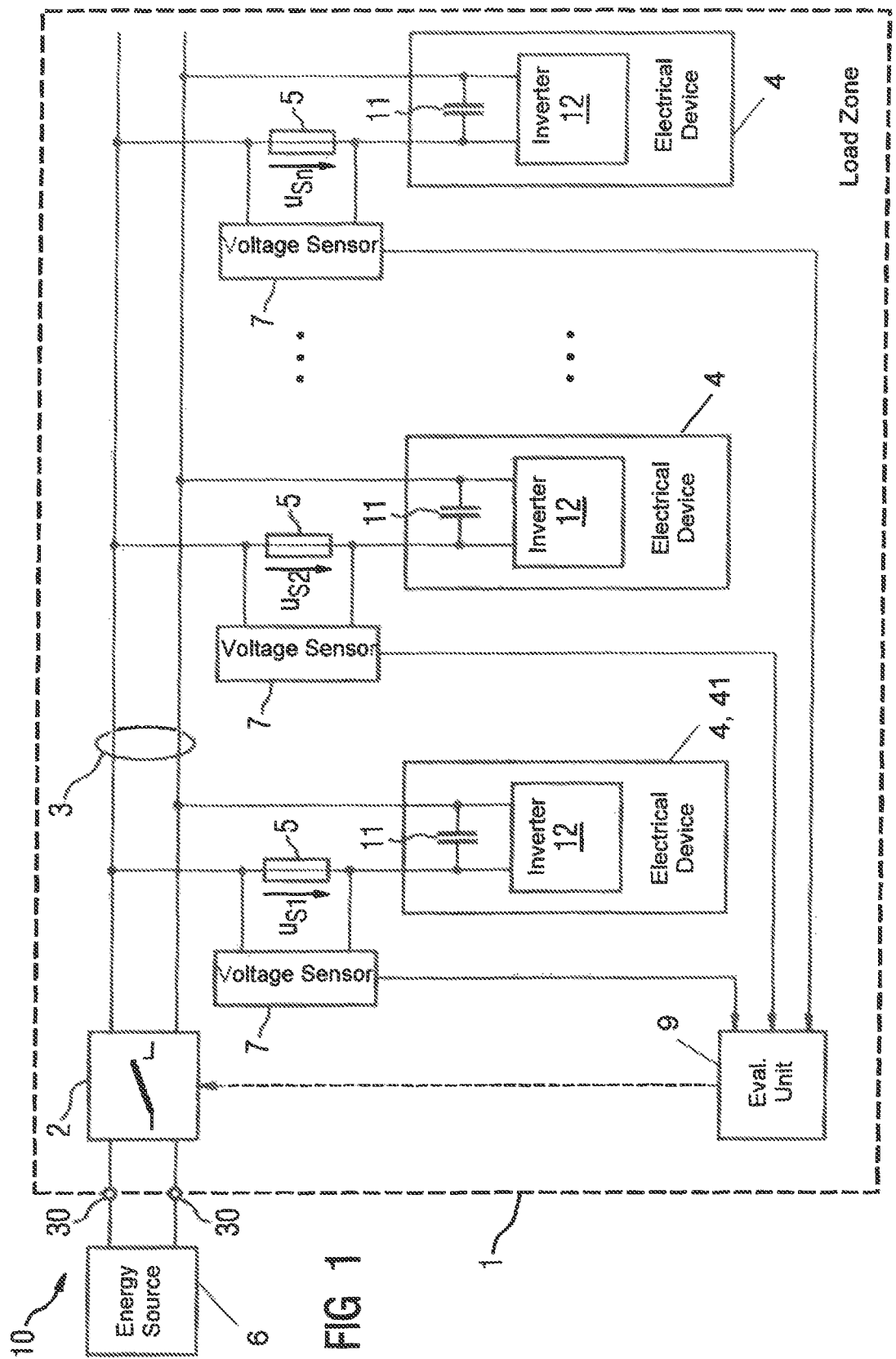
FIG. 1 shows a DC system with a load zone.

FIG. 1 shows a DC system 10 comprising a load zone 1 and an energy source 6. The energy source 6 in this case can be embodied as a voltage source, for example. The energy source 6 is connected to connection interfaces 30 of the load zone 1 and supplies electrical energy to the electrical devices 4 of the load zone 1. For this purpose, a DC bus 3 is arranged in the load zone 1 and carries the voltage to the electrical devices 4. The electrical devices 4 are connected to the DC bus 3 in this case via an electrical connection. A fuse 5 is arranged in this electrical connection respectively for each electrical device 4 of the load zone 1, The voltage $u_{Sx}$ across the fuse 5 is captured by the voltage sensor 7. The captured values of the voltage across the respective fuses 5 are transmitted by the voltage sensors 7 to an evaluation unit 9. If a number n of electrical devices 4 are present in the load zone, this means that in total the number n of fuses 5 and therefore also the number n of voltage sensors 7 are also present. The designation of the voltage $u_{Sx}$ represents the voltage at the $x^{th}$ fuse 5, where x then assumes a value between 1 and n. Electrical devices 4 in this exemplary embodiment take the form of inverters 12, each of which has an indirect capacitor 11. Alternatively, electrical devices can also be present as any type of electrical consumer unit and/or energy storage unit.

If a short circuit occurs in or at one of the electrical devices 4, the indirect capacitors 11 of the remaining electrical devices 4 also feed into this short circuit. Moreover, further energy from the individual inverters 12 can also be fed into this short circuit. For the purpose of separating the load zone 1 from the energy source 6, the load zone 1 has an electronic switch 2 which is arranged between the connection interfaces 30 of the load zone and the DC bus 3, Using this electronic switch 2, the energy supply from the energy source 6 to the electrical devices 4 of the load zone 1 can quickly be interrupted.

If a fault occurs in a first electrical device 41, e.g. a short circuit, the current from the energy source 6 and the further electrical devices 4 consequently causes the fuse 5 to trip in the corresponding connection between the first electrical device 41 and the DC bus 3. As a result of the tripping of the corresponding fuse 5, the site of the fault at the first electrical device 41 can be localized definitively.

If however a protection device, which is not described in detail here, of the DC system 10 or of the load zone 1 detects a fault within this load zone 1, the electronic switch 2 can be opened as a reaction to this and already before the fuse 5 has tripped. In this case, no more electrical energy is fed into the short circuit of the first electrical device 41 by the energy source 6 after the opening of the electronic switch 2. Only the remaining electrical devices 4 feed energy, e.g. from the indirect capacitors 11 and/or the inverter 12, into the short circuit of the first electrical device 41. In this case, the corresponding current through the fuse 5 can be so small that the fuse 5 no longer trips but remains conductive. In this case, the defective first electrical device can no longer be detected on the basis of the status of the fuse 5. For this purpose, nowadays a current sensor is usually installed in series with the fuse in order that currents caused by e.g. a short circuit can be detected.

However, in order to also allow localization of the fault without a current sensor, i.e. omitting a current sensor, the voltage $u_{Sx}$ dropping across the fuse 5 is measured for the individual fuses 5 of the load zone 1 in each case. The polarity of the measurement by the voltage sensor 7 in this case is such that an electrical energy flowing into the electrical device 4 is captured as a positive voltage. The electrical device 4 with the highest voltage $u_{Sx}$ measurement is detected as the defective electrical device. It can be assumed that the fault, in particular the short circuit, is present at this device. As a result of using the fuse 5, which is required in any case, as a type of instrument shunt of a current sensor, no additional component is required in the energy path. However, unlike an instrument shunt of a current sensor, the resistance value of the fuse 5 is rather imprecise and subject to considerable variability among the various fuses 5. It is nonetheless possible, even with this significant variability/imprecision in the resistance of the fuses 5 to distinguish an operating current from a current in the event of a fault. Significant demands are generally made on an instrument shunt in order to be able to perform fault detection and fault localization with corresponding precision. It has been shown that these otherwise normal demands on the resistance of the fuse 5 do not have to be satisfied in order to be able reliably to distinguish an operating current from a fault current. This also means that no additional losses are generated in the feed line between the DC system 3 and the electrical device 4, The evaluation unit 9 can identify which of the electrical devices 4 is defective on the basis of the values transferred by the voltage sensors 7.

If a fault has already been detected in the load zone 1, e.g. on the basis of an overcurrent, and the electronic switch 2 is already open, the fault can be localized more precisely within the load zone 1 by comparing the voltage levels of the voltage $u_{Sx}$ dropping across the respective fuses 5 with each other. The electrical device at which the highest voltage $u_{Sx}$ drops across the fuse 5 in the connection between the electrical device and the DC bus 3 is detected as the defective device. It is alternatively or additionally possible to detect a defective device in that the voltage $u_{Sx}$ dropping across the fuse 5 exceeds a specifiable limit value. As a result of this transgression of the limit value, it can be assumed that a fault is present in this device and therefore in the load zone 1. The detection of the fault can optionally also be used by the evaluation unit 9 to open the electronic switch 2 as marked by a broken line in FIG. 1.

Figure 2:
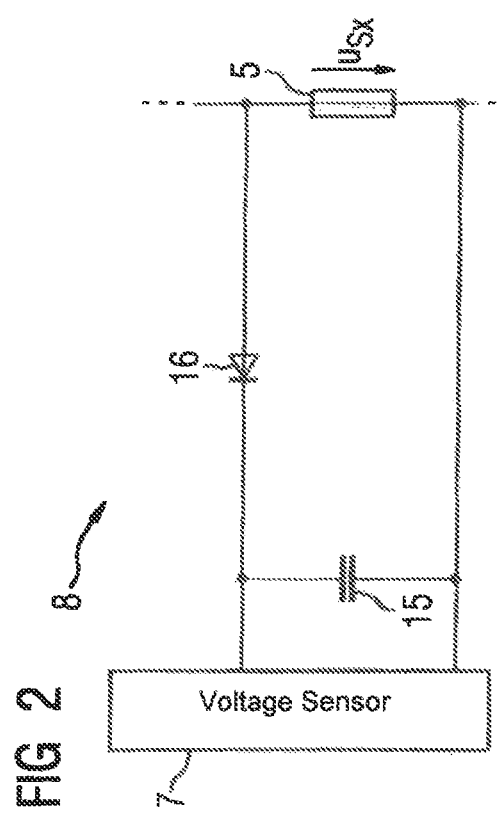

It has also proven advantageous to capture and store the individual voltages $u_{Sx}$ which drop across the respective fuses 5. Furthermore, it has proven advantageous alternatively or additionally to capture and store the peak value of the voltage $u_{Sx}$ across the fuse 5. In this case, the peak value can be determined and stored e.g. by means of a peak value rectifier 8 (not shown here) or in the data processing entity, i.e. in the evaluation unit 9. In the case of a peak value rectifier 8, the storage can be effected hi that the peak value is continuously present across a capacitor 15. This is described and explained in greater detail below in FIG. 2 to FIG. 5. By virtue of knowing the peak value, localization of the fault by comparing the peak values of the voltages $u_{Sx}$ is still possible if there is no short-circuit current flow or only a slight short-circuit current flow, FIG. 2 shows an exemplary embodiment of a peak value rectifier 8. This allows the peak value of a voltage $u_{Sx}$ across the fuse 5 to be generated at the rectification capacitor 15, As soon as the voltage $u_{Sx}$ across the fuse 5 is greater than the voltage at the rectification capacitor 15, the rectification capacitor 15 is charged via the diode 16 until the voltage at the rectification capacitor 15 has also reached the voltage $u_{Sx}$ across the fuse 5. If the voltage $u_{Sx}$ across the fuse 5 falls back again, a discharge current of the rectification capacitor 15 is prevented by the diode 16 and the peak value of the voltage $u_{Sx}$ across the fuse 5 remains at the rectification capacitor 15. This corresponds to a storage of the peak value of the voltage $u_{Sx}$ across the fuse 5, The voltage sensor 7 can then pick up the stored peak value and transfer it to an evaluation unit 9 (not illustrated here). The determination of the defective electrical device can then take place in the evaluation unit 9.

The advantage of this peak value rectifier 8 is that data does not have to be continuously captured and/or transmitted. If a fault occurs and/or is detected in the load zone 1, the determination can take place in the evaluation unit 9 because the corresponding peak values are available to the evaluation unit or can be made available by the voltage sensor 7 as a voltage at the rectification capacitor 15, even after the fault has occurred and the electronic switch 2 has opened.

Figure 3:
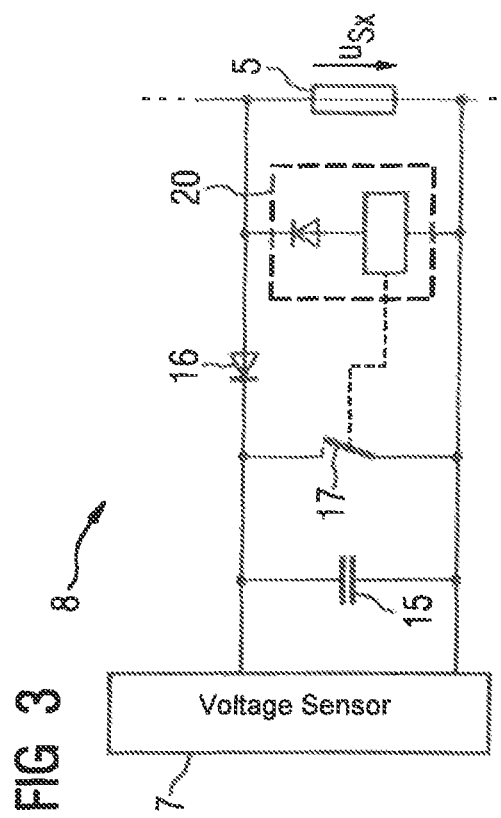
FIG. 2 to FIG. 5 show exemplary embodiments of an advantageous peak value rectifier.

FIG. 3 shows a further exemplary embodiment of the peak value rectifier 8. For the avoidance of repetition, reference is made to the description for FIG. 2 and the reference signs assigned therein. This exemplary embodiment additionally has a switch 17 which is activated by a polarity capture 20. If the voltage $u_{Sx}$ across the fuse 5 assumes a negative value, the polarity capture 20 detects this and closes the switch 17. The rectification capacitor 15 is thereby short-circuited and discharged. The voltage at the rectification capacitor assumes the value zero in this case. This means that the peak value that is present and stored at the rectification capacitor is reset. Alternatively, a resistance can be arranged in series with the switch 17. Using this arrangement, the capacitor is then discharged continuously and not suddenly. This corresponds to a reduction of the stored value.

As soon as the voltage $u_{Sx}$ across the fuse 5 assumes positive values, the switch 15 opens and the peak value of the voltage $u_{Sx}$ across the fuse 5, which peak value occurred since the opening of the switch 17, is present at the rectification capacitor again.

The switch 17 can be part of a contactor, said switch 17 being a switching contact of the contactor and the coil of the contactor being part of the polarity capture 20. A diode of the polarity capture 20 ensures that a voltage is applied to the coil of the contactor as soon as the voltage $u_{Sx}$ across the fuse 5 is negative. This voltage causes the contactor to react whereby the switch 17 is dosed.

Figure 4:
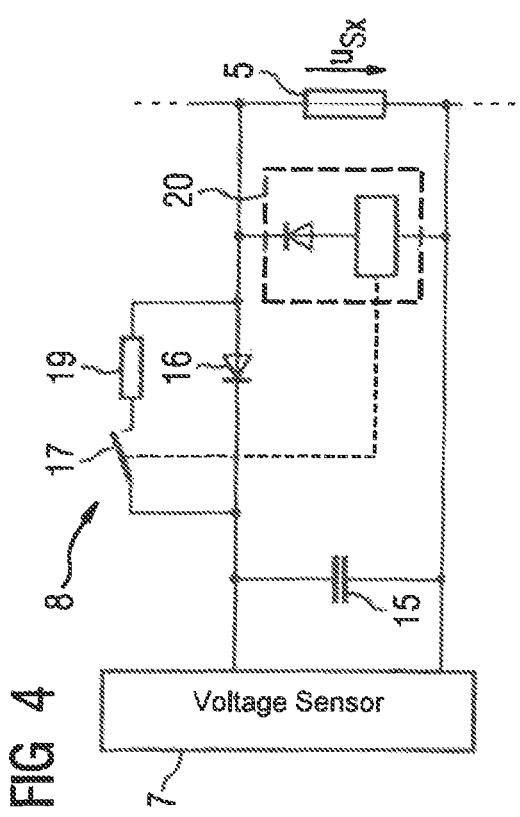

FIG. 4 shows a further exemplary embodiment of the peak value rectifier 8. For the avoidance of repetition, reference is made to the description for FIG. 2 and FIG. 3 and the reference signs assigned therein. This exemplary embodiment likewise has the switch 17 and the polarity capture 20. In this case, the switch 17 is so arranged that the voltage at the rectification capacitor 15 is reduced and not suddenly discharged in the event of a negative voltage $u_{Sx}$ across the fuse 5. In this case, a resistance 19 is arranged in series with the switch 17. The magnitude of the resistance value of the resistance 19 in this case determines the speed with which the voltage is reduced at the rectification capacitor 15. The reduction of the voltage at the rectification capacitor 15 signifies a reduction in the stored data value of the peak value.

By resetting or reducing the stored data value for the peak value, it is much easier to detect the defective electrical device. This is because the non-defective electrical devices often release energy when a fault occurs in the load zone and therefore a negative voltage is produced at the fuse. Therefore the defective device, at which a positive voltage is present at least at the instant of the fault, can be identified even more easily and reliably since at least some of the correctly functioning electrical devices have a negative voltage $u_{Sx}$ at their assigned fuse 5 and thereby reduce the stored data value.

Figure 5:
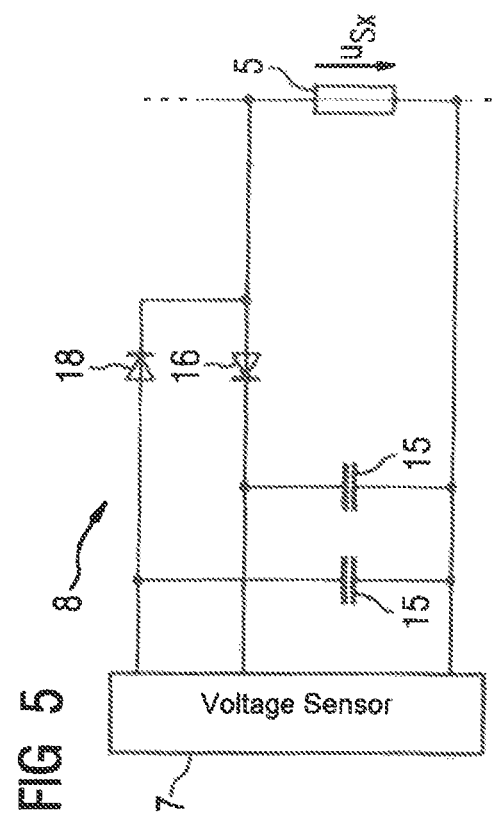

FIG. 5 shows a further exemplary embodiment of the peak value rectifier 8. For the avoidance of repetition, reference is made to the description for FIG. 2 to FIG. 4 and the reference signs assigned therein. This exemplary embodiment no longer has a switch 17 or a polarity capture 20. In this peak value rectifier 8, a positive peak value is determined and stored with the aid the diode 16 in a similar manner to the exemplary embodiments in FIG. 2 to FIG. 4. In addition to this, a negative peak value is determined with the aid of a further diode 18 and stored as a voltage at the second rectification capacitor 15. The negative peak value is defined as the greatest absolute value of a negative voltage. This positive and negative peak value can be captured in each case by the voltage capture 7 and supplied to the evaluation unit 9. The knowledge of positive and negative peak values can further increase the reliability of determining the defective electrical device, since in addition to a comparison of the data values of different electrical devices, a positive and a negative peak value is also available for each electrical device. In this way, the positive and the negative peak value can be compared with each other as a further criterion for the determination of the defective electrical device.

In summary, the invention relates to a load zone comprising an electronic switch, a DC bus and at least two electrical devices, the electronic switch being so arranged as to separate the DC bus from an energy source that can be connected to the load zone, the electrical devices being electrically connected to the DC bus in each case. In order to improve the fault detection in the load zone, it is proposed to arrange a fuse between the DC bus and the respective electrical device, a voltage sensor being so arranged as to be able to capture a voltage across the fuse. The invention further relates to a DC system comprising such a load zone and at least one energy source, the energy source being connected to the load zone in such a way that the electrical devices can be supplied with electrical energy from the energy source, the electrical connection between the energy source and the DC bus being interruptible by means of the electronic switch. The invention further relates to a method for operating such a load zone or such a DC system, a defective device of the electrical devices being identified on the basis of the voltage across the fuse.

In other words, the invention relates to a load zone comprising an electronic switch, a DC bus, a connection interface for supplying the load zone with electrical energy, and at least two electrical devices, the electronic switch being arranged between the connection interface and the DC bus, the electrical devices each being electrically connected in parallel to the DC bus. In order to improve the fault detection and fault localization in the load zone, it is proposed to arrange a fuse between the DC bus and the respective electrical device, a voltage sensor being so arranged as to capture a voltage across the fuse. The invention further relates to a DC system comprising such a load zone and at least one energy source, the energy source being connected to the connection interface of the load zone. The invention further relates to a method for operating such a load zone or such a DC system, a defective device of the electrical devices being identified on the basis of the voltage across the fuse in that the voltage across the fuse exceeds a specifiable limit value.

The invention claimed is:

1. A load zone, comprising:
 a connection interface for supplying the load zone with electrical energy;
 a DC bus:
 an electronic switch arranged between the connection interface and the DC bus;
 at least two electrical devices, each electrically connected in parallel to the DC bus;
 a fuse arranged between the DC bus and a respective one of the at least two electrical devices;
 a voltage sensor configured to measure a voltage across the fuse; and
 an evaluation unit configured to identify a defective device of the at least two electrical devices based on a polarity of the voltage measured by the voltage sensor across the fuse.

2. The load zone of claim 1, wherein the connection between the DC bus and a respective one of the at least two electrical devices is constructed without a current transformer.

3. The load zone of claim 1, wherein a peak value of the voltage across the fuse is measured and stored as a stored data value which is reduced, in particular reset, when the voltage measured across the fuse is negative.

4. The load zone of claim 3, further comprising a peak value rectifier arranged between the fuse and the voltage sensor, with the peak value rectifier measuring the peak value of the voltage across the fuse.

5. The load zone of claim 3, wherein a further data value is captured and stored, with the stored data value measuring and storing a positive peak value, and the further data value measuring and storing a negative peak value.

6. A DC system, comprising:
 at least one energy source;
 a load zone comprising a connection interface connected to the at least one energy source, with the at least one energy source supplying the load zone with electrical energy;
 a DC bus;
 an electronic switch arranged between the connection interface and the DC bus and configured to interrupt the electrical connection between the energy source and the DC bus;
 at least two electrical devices, each electrically connected in parallel to the DC bus;
 a fuse arranged between the DC bus and a respective one of the at least two electrical devices;
 a voltage sensor configured to measure a voltage across the fuse; and
 an evaluation unit configured to identify a defective device based on a polarity of the voltage measured by the voltage sensor across the fuse of the defective device.

7. A method for fault localization in a load zone of a DC system, comprising:

measuring with a voltage sensor a voltage across a fuse of the load zone arranged between a DC bus and a respective one of at least two electrical devices electrically connected in parallel to the DC bus; and identifying a defective device of the at least two electrical devices based on a polarity of the voltage measured by the voltage sensor across the fuse of the defective device.

8. The method of claim 7, wherein the defective device is identified when the voltage measured across the fuse of the defective device exceeds a specified limit value.

9. The method of claim 8, further comprising comparing voltage levels of a voltage drop measured across respective fuses of the at least two electrical devices, and identifying the electrical device of the at least two electrical devices having a highest voltage level as the defective device.

10. The method of claim 9, further comprising when or after a fault occurs in the load zone, measuring and storing as a stored data value a peak value of the voltage drop, and identifying the defective device as a function of the stored data value.

11. The method of claim 10, further comprising identifying the defective device as the device having a highest peak value of all measured voltage drops, as measured across the fuse associated with the defective device.

12. The method of claim 10, wherein the stored data value is reduced, in particular reset, when the voltage drop measured as across the fuse has a negative polarity.

13. The method of claim 10, further comprising:

measuring and storing a further data value, with the stored data value measuring a positive peak value, and with the further data value measuring a negative peak value of the voltage drop measured as across the fuse.

14. The method of claim 13, further comprising capturing and storing a time when the stored data value or the further data value occurs, and detecting the defective device depending on the captured and stored time.

15. The method of claim 7, wherein the method is started when a fault is present in the load zone.

* * * * *